United States Patent
Chen et al.

(10) Patent No.: US 10,806,255 B1
(45) Date of Patent: Oct. 20, 2020

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/689,424

(22) Filed: Nov. 20, 2019

(30) Foreign Application Priority Data

Jun. 12, 2019 (TW) .............................. 108120603 A

(51) Int. Cl.
*A47B 88/00* (2017.01)
*A47B 88/483* (2017.01)
*A47B 88/423* (2017.01)

(52) U.S. Cl.
CPC .......... *A47B 88/483* (2017.01); *A47B 88/423* (2017.01)

(58) Field of Classification Search
CPC ...... A47B 2210/0016; A47B 2210/007; A47B 2210/0081; A47B 88/57
See application file for complete search history.

(56) References Cited

U.S. PATENT DOCUMENTS

| | | | | |
|---|---|---|---|---|
| 4,679,950 A | * | 7/1987 | Delmege ................ | A47B 88/57 312/333 |
| 6,367,899 B1 | * | 4/2002 | Hwang ................... | A47B 88/57 312/334.47 |
| 6,375,290 B1 | * | 4/2002 | Lin ......................... | A47B 88/49 312/334.44 |
| 7,677,679 B2 | | 3/2010 | Hsiung et al. | |
| 7,918,517 B2 | | 4/2011 | Chen et al. | |
| 8,240,789 B2 | | 8/2012 | Chen et al. | |
| 8,317,278 B2 | | 11/2012 | Enos | |
| 9,629,459 B2 | | 4/2017 | Chen et al. | |
| 9,681,749 B2 | | 6/2017 | Chen et al. | |

(Continued)

FOREIGN PATENT DOCUMENTS

| | | |
|---|---|---|
| EP | 3253189 A1 | 12/2017 |
| EP | 3275338 A1 | 1/2018 |
| EP | 3488733 A1 | 5/2019 |

OTHER PUBLICATIONS

International Search Report Issued by a Foreign Patent Office for No. 19215215.5-1011.

*Primary Examiner* — Matthew W Ing
(74) *Attorney, Agent, or Firm* — Rosenberg, Klein & Lee

(57) ABSTRACT

A slide rail assembly includes a first rail, a second rail, a third rail, a locking member, and an operating member. The second rail is displaceable with respect to the first rail from a first position to a second position. The third rail is displaceable with respect to the second rail. The locking member can prevent the second rail from displacement with respect to the first rail from the second position toward the first position when in a first state. The operating member can be operated in order to switch the locking member from the first state to a second state, in which the second rail is displaceable with respect to the first rail from the second position toward the first position.

19 Claims, 14 Drawing Sheets

(56) References Cited

U.S. PATENT DOCUMENTS

| | | | | |
|---|---|---|---|---|
| 2007/0164644 A1* | 7/2007 | Hwang | .................. | A47B 88/49 |
| | | | | 312/333 |
| 2007/0241651 A1* | 10/2007 | Burgess, III | ......... | A47B 88/493 |
| | | | | 312/333 |
| 2008/0278048 A1* | 11/2008 | Burgess, III | ......... | A47B 88/493 |
| | | | | 312/333 |
| 2011/0135224 A1* | 6/2011 | Chen | .................... | H05K 7/1489 |
| | | | | 384/26 |
| 2012/0043872 A1* | 2/2012 | Enos | .................... | A47B 88/493 |
| | | | | 312/332.1 |
| 2012/0308297 A1* | 12/2012 | Chen | ..................... | A47B 88/49 |
| | | | | 403/109.2 |
| 2013/0259411 A1* | 10/2013 | Judge | .................. | A47B 88/493 |
| | | | | 384/49 |
| 2016/0296017 A1* | 10/2016 | Chen | .................... | A47B 96/061 |
| 2018/0031037 A1* | 2/2018 | Chen | ..................... | A47B 88/43 |

* cited by examiner

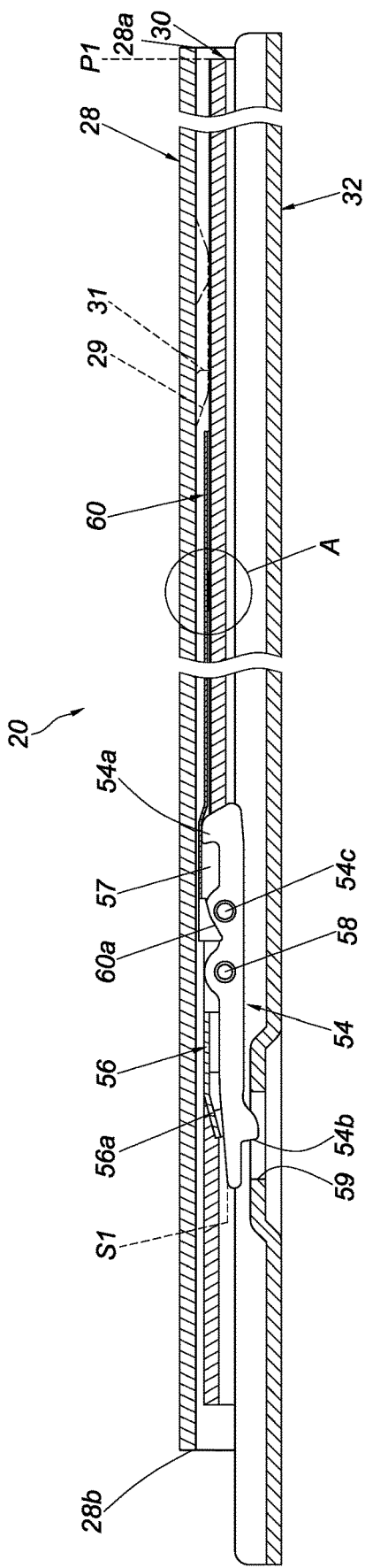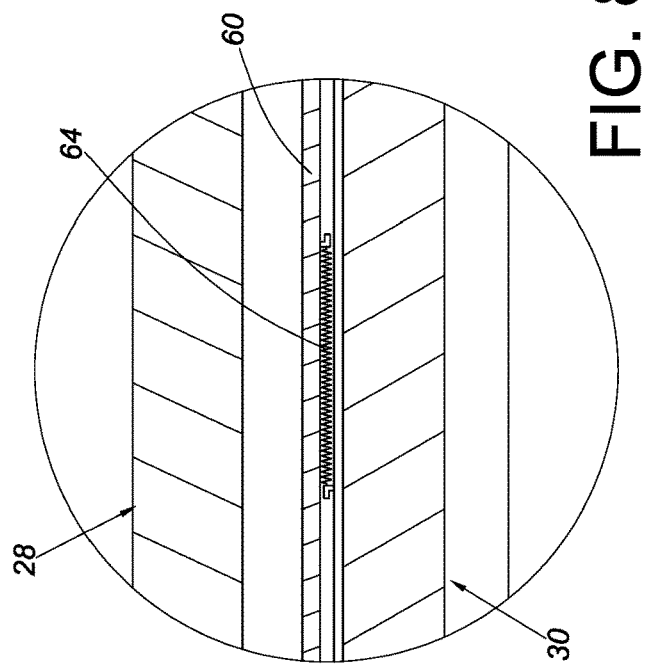
FIG. 7
FIG. 8

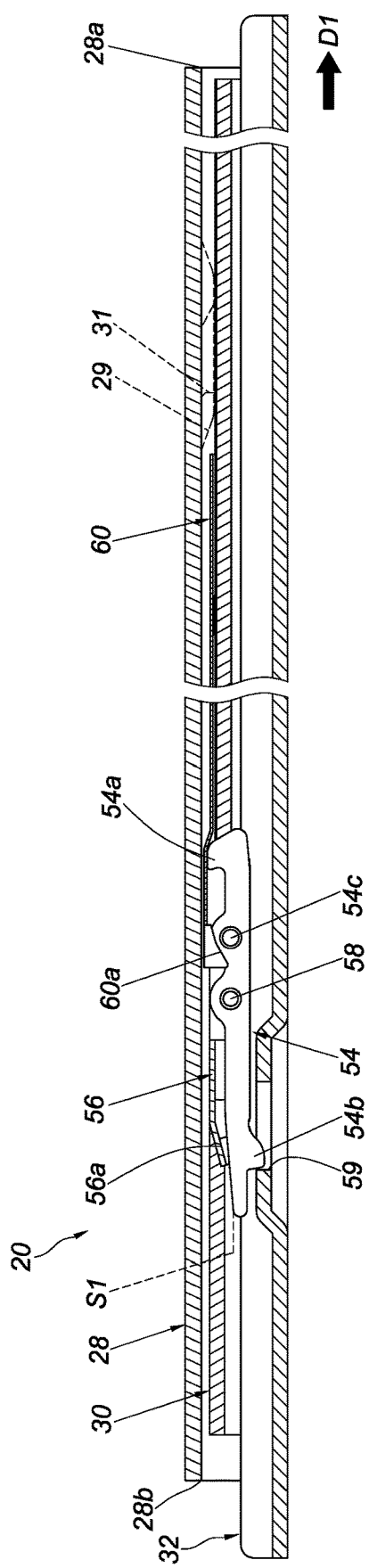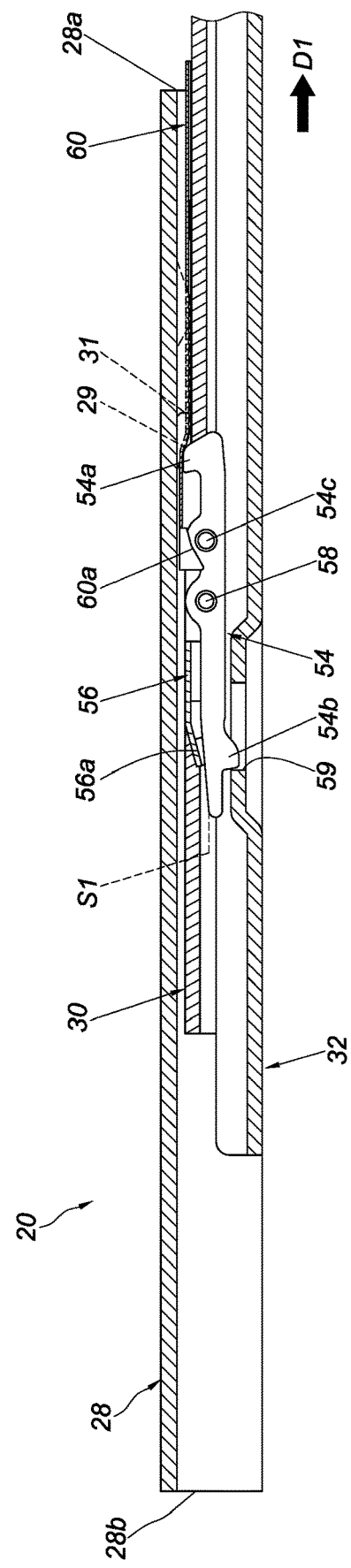
FIG. 9
FIG. 10

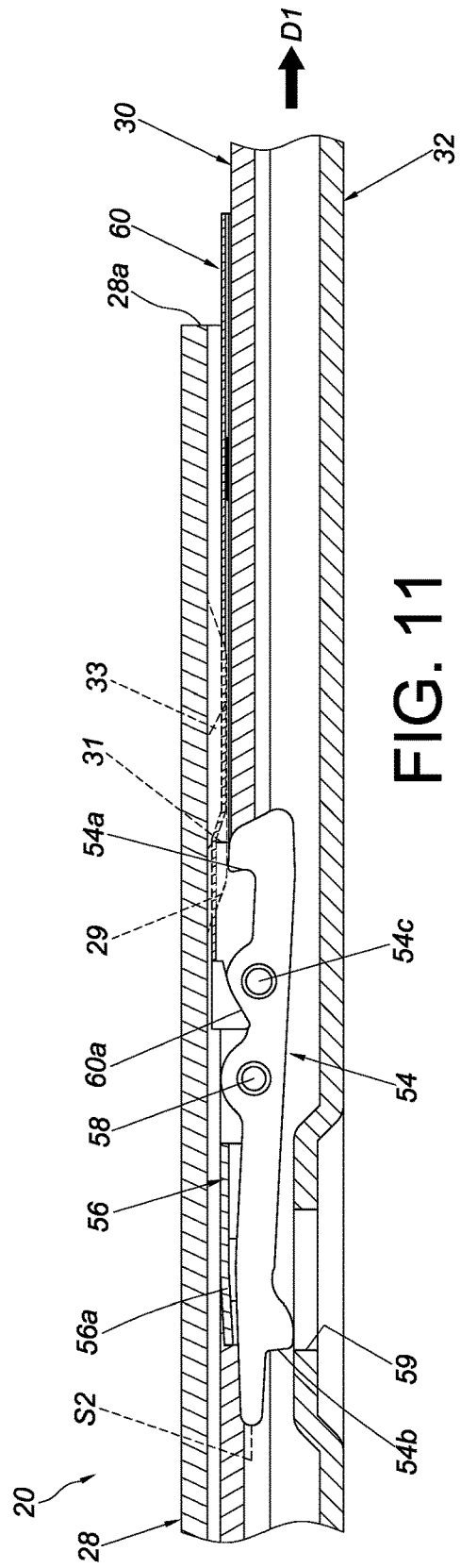
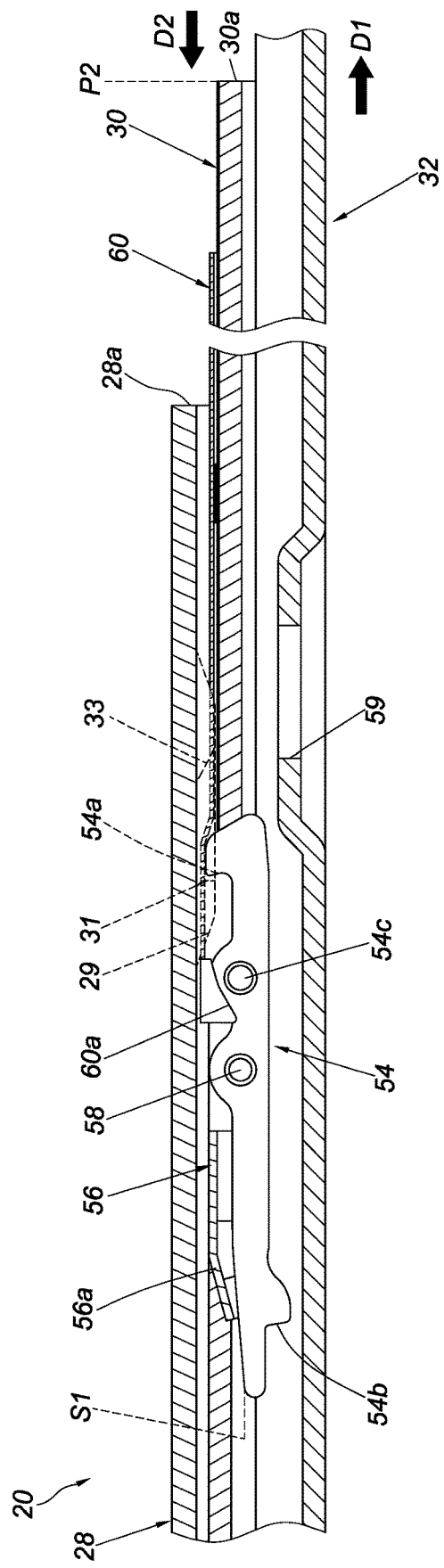
FIG. 11
FIG. 12

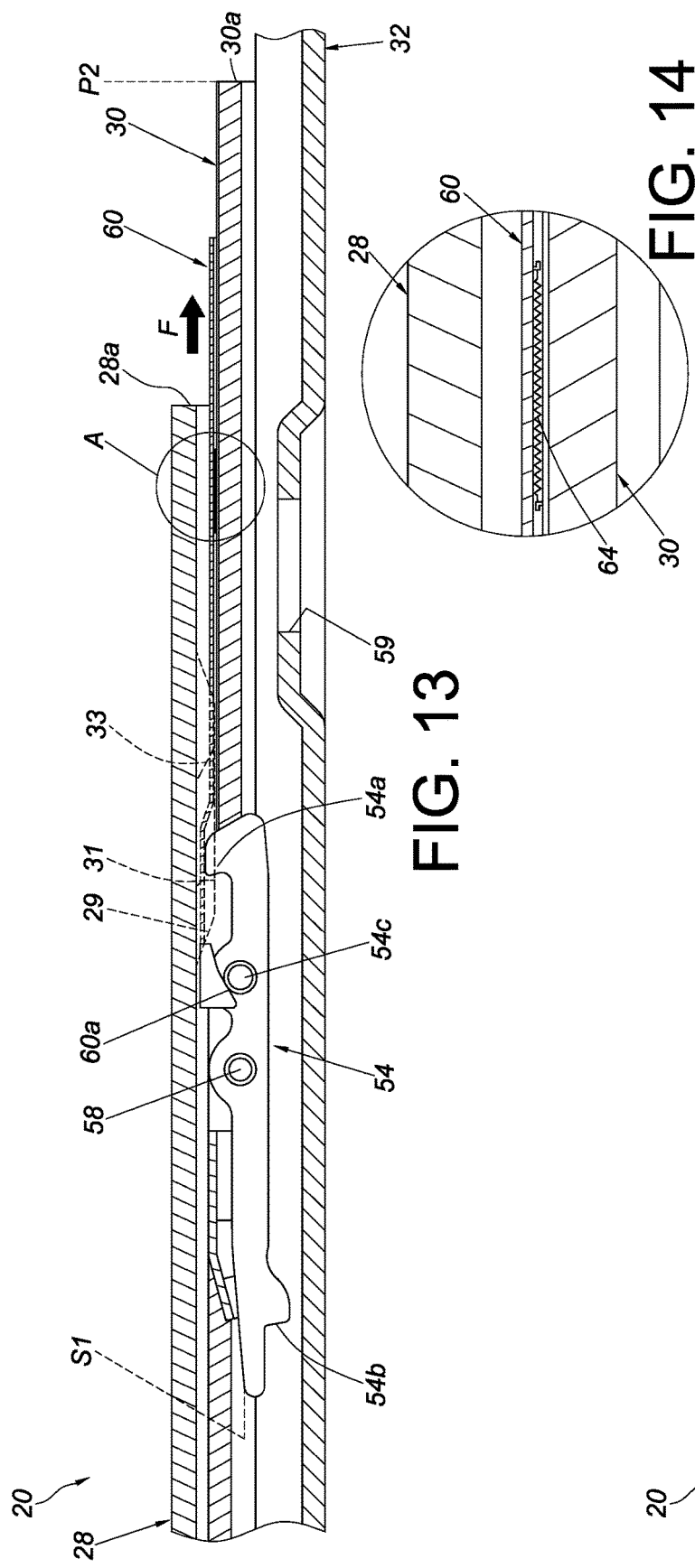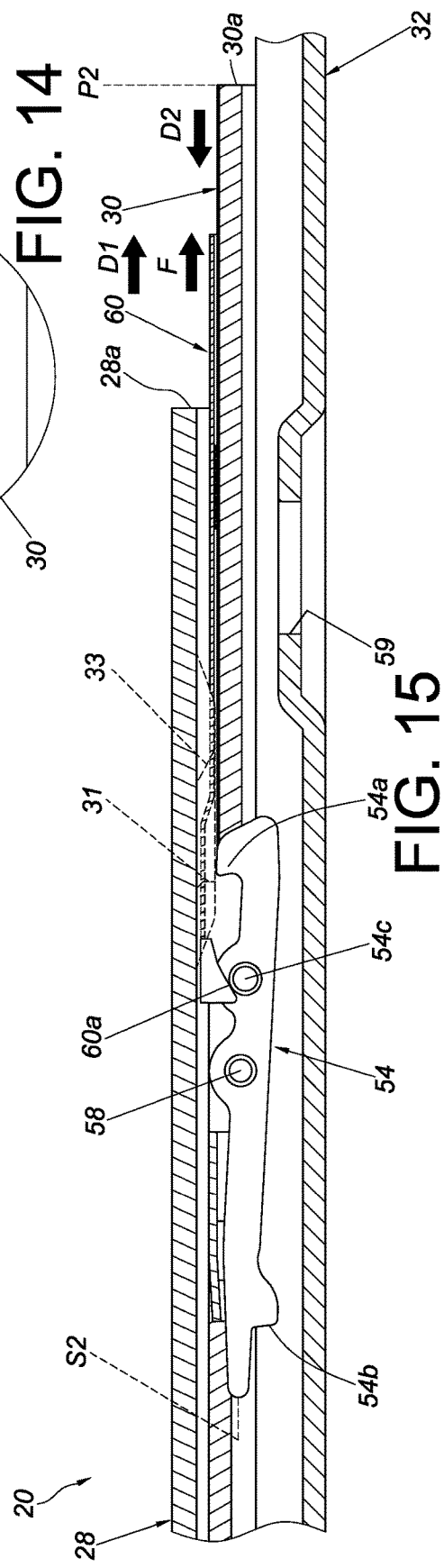

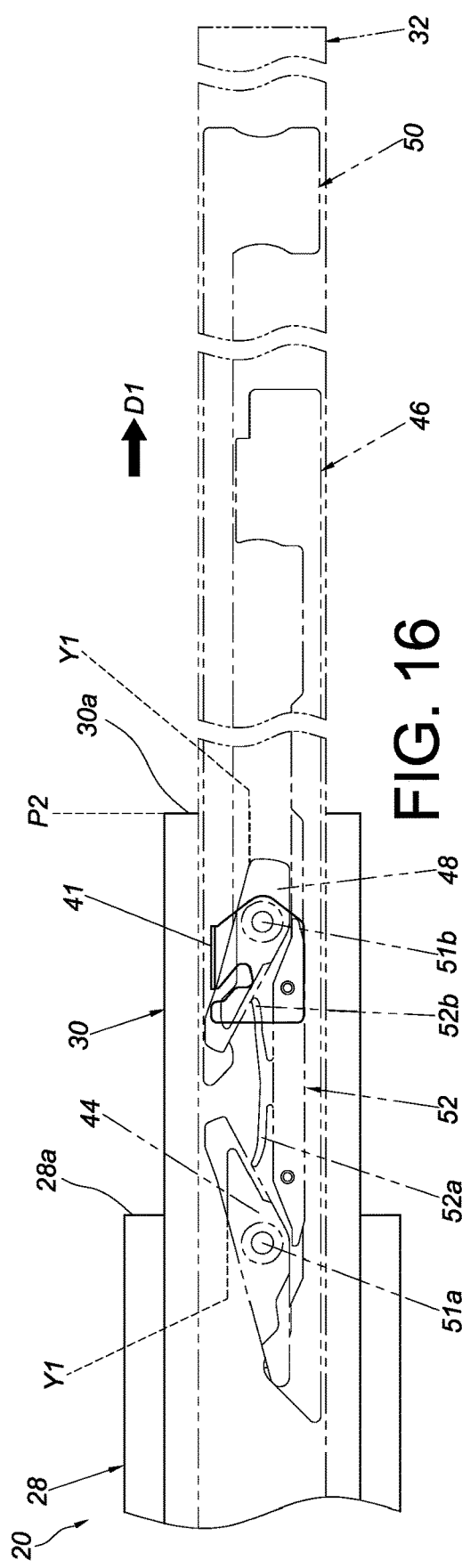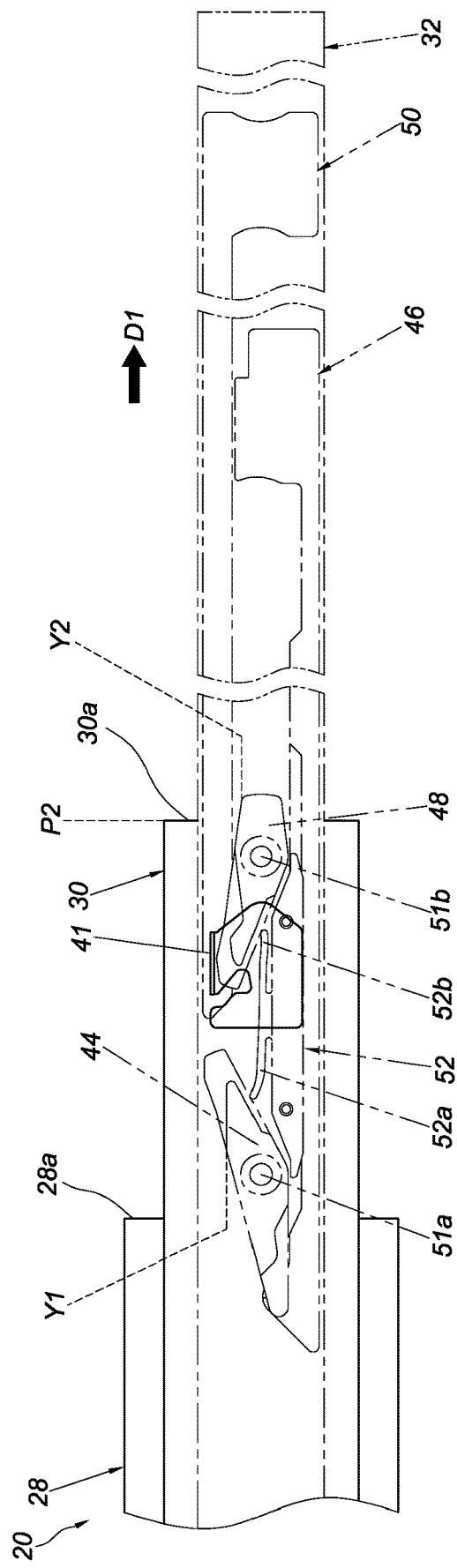

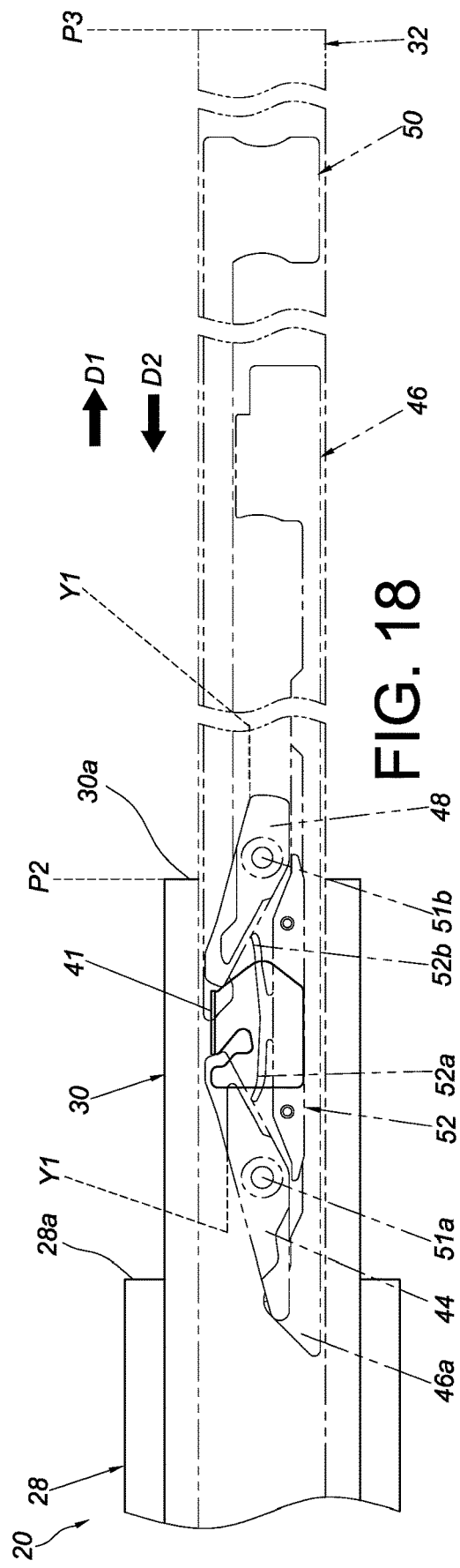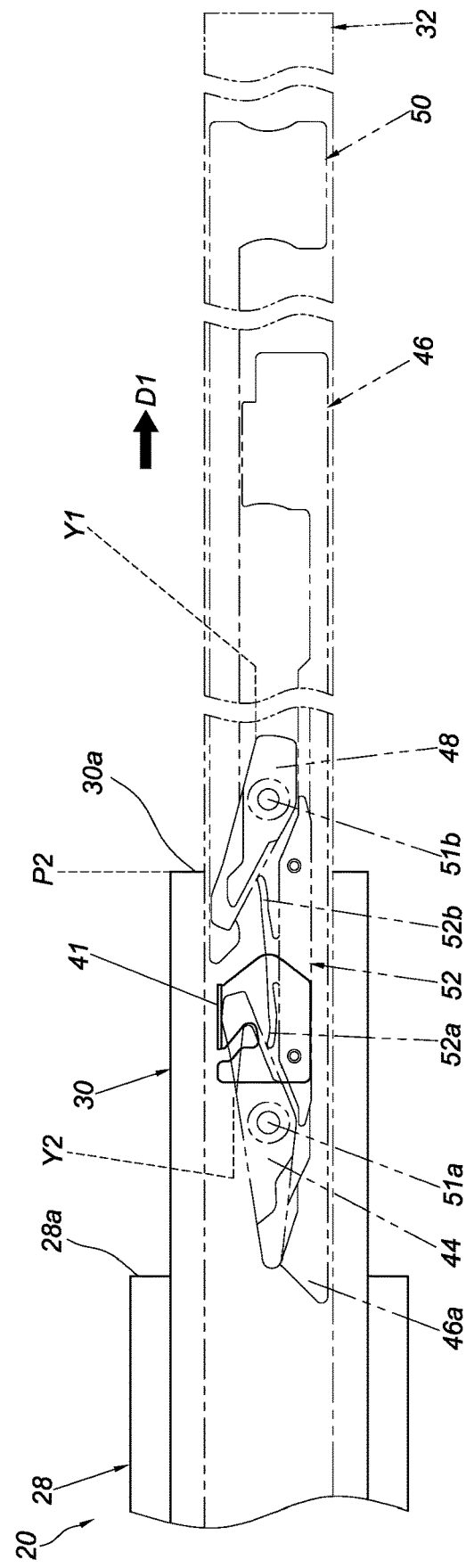

SLIDE RAIL ASSEMBLY

FIELD OF THE INVENTION

The present invention relates to a slide rail assembly and more particularly to a slide rail assembly with three slide rails and an operating member, wherein the operating member can be operated to unlock two of the slide rails (e.g., the middle rail and the outer rail) from each other when the slide rail assembly is locked in an extended state.

BACKGROUND OF THE INVENTION

Generally, a slide rail assembly includes at least two slide rails that can be displaced relative to each other to bring the slide rail assembly into an extended or retracted state.

For example, U.S. Pat. No. 7,677,679 B2 discloses a slide rail assembly including a first rail, a second rail, and a third rail. The first rail includes a stop and a block. The second rail has a stop piece and a slot for receiving a retention pin. When the three rails are in a fully extended state, the retention pin and the stop piece are resisted by the stop and the block of the first rail respectively, thereby restraining the second rail from displacement relative to the first rail. When the third rail is retracted from the fully extended state to a semi-extended state, the retention pin is lifted by a releasing member of the third rail and disengaged from the stop, thereby allowing the second rail to be retracted relative to the first rail.

U.S. Pat. No. 8,240,789 B2 discloses a slide rail assembly including a first rail, a second rail, and a third rail. The first rail includes a positioning portion. A positioning device is disposed on the second rail and includes a positioning member and an engaging member pivotably connected to the positioning member. As can be known from FIG. 6, FIG. 7, and FIG. 8 of the specification of this US patent, an engaging portion of the engaging member is hooked to a stop end of the positioning portion of the first rail when the second rail reaches a certain position after being pulled out relative to the first rail in an extending direction; as a result, the second rail is kept from being displaced relative to the first rail in a retracting direction, whereas the third rail can be pulled out relative to the second rail in the extending direction to enter an extended state. FIG. 9 of the specification of this US patent also shows that by retracting the third rail relative to the second rail in the retracting direction, an extension wing of the engaging member will be pushed by a sidewall of the third rail such that the engaging member is pivoted and thus releases the engaging portion from the stop end of the positioning portion of the first rail, allowing the second rail to be retracted relative to the first rail in the retracting direction.

The foregoing slide rail assemblies rely on either the third rail or a fitting attached to the third rail to unlock the second rail from the first rail and thereby allow the second rail to be retracted relative to the first rail in the retracting direction from the extended state. Sometimes, however, the application environment or user of a slide rail assembly may require or desire that the second rail not be unlocked by retracting the third rail relative to the second rail. It is therefore worthwhile to develop a slide rail assembly whose second rail is not unlocked from the first rail by the user operating the third rail.

SUMMARY OF THE INVENTION

The present invention provides a slide rail assembly in which an operating member can be operated by the user to unlock two slide rails from each other.

According to one aspect of the present invention, a slide rail assembly includes a first rail, a second rail, a third rail, a locking member, and an operating member. The second rail can be displaced with respect to the first rail from a first position to a second position. The third rail can be displaced with respect to the second rail. The locking member can be switched between a first state and a second state and is configured to prevent the second rail from being displaced with respect to the first rail from the second position toward the first position when in the first state. The operating member can be manually operated in order for a driving portion of the operating member to drive a linking feature of the locking member and thereby switch the locking member from the first state to the second state, in which the second rail can be displaced with respect to the first rail from the second position toward the first position.

Preferably, the locking member is movably mounted on the second rail.

Preferably, the slide rail assembly further includes an elastic member for applying an elastic force to the locking member and thereby keep the locking member in the first state.

Preferably, the first rail includes a guiding portion and a first blocking feature, the locking member includes an engaging portion and a contact portion, and a pivotally connecting element is disposed between the engaging portion and the contact portion to pivotally connect the locking member to the second rail. When the locking member is in the first state, the engaging portion of the locking member is configured to be locked to the first blocking feature.

Preferably, when the locking member is in the first state, the third rail can drive the second rail through the contact portion of the locking member such that the second rail is displaced simultaneously with the third rail in a first direction. When the second rail reaches a predetermined position after being displaced simultaneously with the third rail in the first direction, the locking member comes into contact with the guiding portion of the first rail such that a force acting on the locking member brings the locking member out of the first state and thereby terminates the simultaneous displacement relationship between the second rail and the third rail. When the second rail reaches the second position after being further displaced in the first direction, the locking member is switched back to the first state in response to the elastic force of the elastic member; as a result, the engaging portion of the locking member is locked to the first blocking feature of the first rail to prevent the second rail from being displaced from the second position to the first position in a second direction.

Preferably, the linking feature is disposed adjacent to the engaging portion.

Preferably, the elastic member applies an elastic load to a portion of the locking member that is adjacent to the contact portion.

Preferably, one of the driving portion of the operating member and the linking feature of the locking member includes an inclined surface or a curved surface.

Preferably, the operating member is movably mounted on the second rail.

Preferably, the second rail includes two opposite sides defined respectively as a first side, which faces the first rail, and a second side, which faces the third rail, and the operating member is located on the first side of the second rail.

Preferably, the linking feature of the locking member is pushed by the driving portion of the operating member when the operating member is operated in the first direction.

Preferably, the operating member includes a slot, and the slide rail assembly further includes a supporting member, wherein the supporting member extends through a portion of the slot and mounts the operating member to the second rail.

Preferably, the slide rail assembly further includes a restoring spring mounted to the operating member and the second rail.

Preferably, the first rail includes a second blocking feature, and when the second rail is at the second position and the locking member is in the first state, the engaging portion of the locking member lies between the first blocking feature and the second blocking feature.

Preferably, the third rail includes a disengaging feature, and when the third rail is displaced in the second direction, the disengaging feature is brought into contact with the contact portion and switches the locking member from the first state to the second state so that the second rail can be displaced from the second position to the first position in the second direction.

Preferably, the second rail includes an abutting feature, and the slide rail assembly further includes a releasing mechanism, wherein the releasing mechanism includes a working member located on the third rail. The working member corresponds in position to the abutting feature when in a first working state and does not correspond in position to the abutting feature when in a second working state.

Preferably, the releasing mechanism further includes a releasing member operably connected to the working member, and the working member can be switched from the first working state to the second working state in response to the releasing member being operated.

According to another aspect of the present invention, a slide rail assembly includes a first rail, a second rail, a third rail, a locking member, and an operating member. The second rail can be displaced with respect to the first rail from a retracted position to an extended position in a first direction. The third rail can be displaced with respect to the second rail. The locking member is movably mounted on the second rail so that when the second rail is at the extended position, the locking member is locked to a blocking feature of the first rail to prevent the second rail from being displaced with respect to the first rail from the extended position to the retracted position in a second direction. The operating member is operably connected to the second rail and includes a driving portion. When the operating member is operated, the driving portion of the operating member drives a linking feature of the locking member and thereby unlocks the locking member from the blocking feature of the first rail.

BRIEF DESCRIPTION OF THE DRAWINGS

FIG. 3 is an exploded perspective view of the slide rail assembly according to the embodiment of the present invention, showing the first rail, the second rail, and the third rail separated from one another;

FIG. 4 is an enlarged view of the circled area A in FIG. 3;

FIG. 7 is a schematic view of the slide rail assembly according to the embodiment of the present invention, showing the slide rail assembly in a retracted state, with the second rail and the third rail at a first position with respect to the first rail;

FIG. 8 is an enlarged view of the circled area A in FIG. 7;

FIG. 9 is a schematic view of the slide rail assembly according to the embodiment of the present invention, showing the second rail and the third rail simultaneously displaced with respect to the first rail in a first direction;

FIG. 10 is a schematic view of the slide rail assembly according to the embodiment of the present invention, showing the second rail and the third rail further displaced simultaneously with respect to the first rail in the first direction;

FIG. 11 is a schematic view of the slide rail assembly according to the embodiment of the present invention, showing the second rail and the third rail at a position where they can no longer be simultaneously displaced with respect to the first rail in the first direction;

FIG. 12 is a schematic view of the slide rail assembly according to the embodiment of the present invention, showing that the second rail is moved to a second position with respect to the first rail and is engaged with the first rail via the locking member, and that the third rail is displaced with respect to the second rail in the first direction;

FIG. 13 is a schematic view of the slide rail assembly according to the embodiment of the present invention, showing that the second rail is at the second position with respect to the first rail, and that the operating member is subjected to a force and therefore operated;

FIG. 14 is an enlarged view of the circled area A in FIG. 13;

FIG. 15 is a schematic view of the slide rail assembly according to the embodiment of the present invention, showing that the second rail is at the second position with respect to the first rail, and that the locking member is subjected to a force and therefore disengaged from the first rail;

FIG. 16 is a schematic view of the slide rail assembly according to the embodiment of the present invention, showing that the second rail is at the second position with respect to the first rail and the third rail is displaced with respect to the second rail in the first direction;

FIG. 17 is a schematic view of the slide rail assembly according to the embodiment of the present invention, showing that the second rail is at the second position with respect to the first rail, and that the third rail is further displaced with respect to the second rail in the first direction;

FIG. 18 is a schematic view of the slide rail assembly according to the embodiment of the present invention, showing that the slide rail assembly is in the extended state;

FIG. 19 is a schematic view of the slide rail assembly according to the embodiment of the present invention, showing that the second rail is at the second position with respect to the first rail, and that the third rail is displaced with respect to the second rail in the first direction in order to be detached;

DETAILED DESCRIPTION OF THE INVENTION

Figure 1:
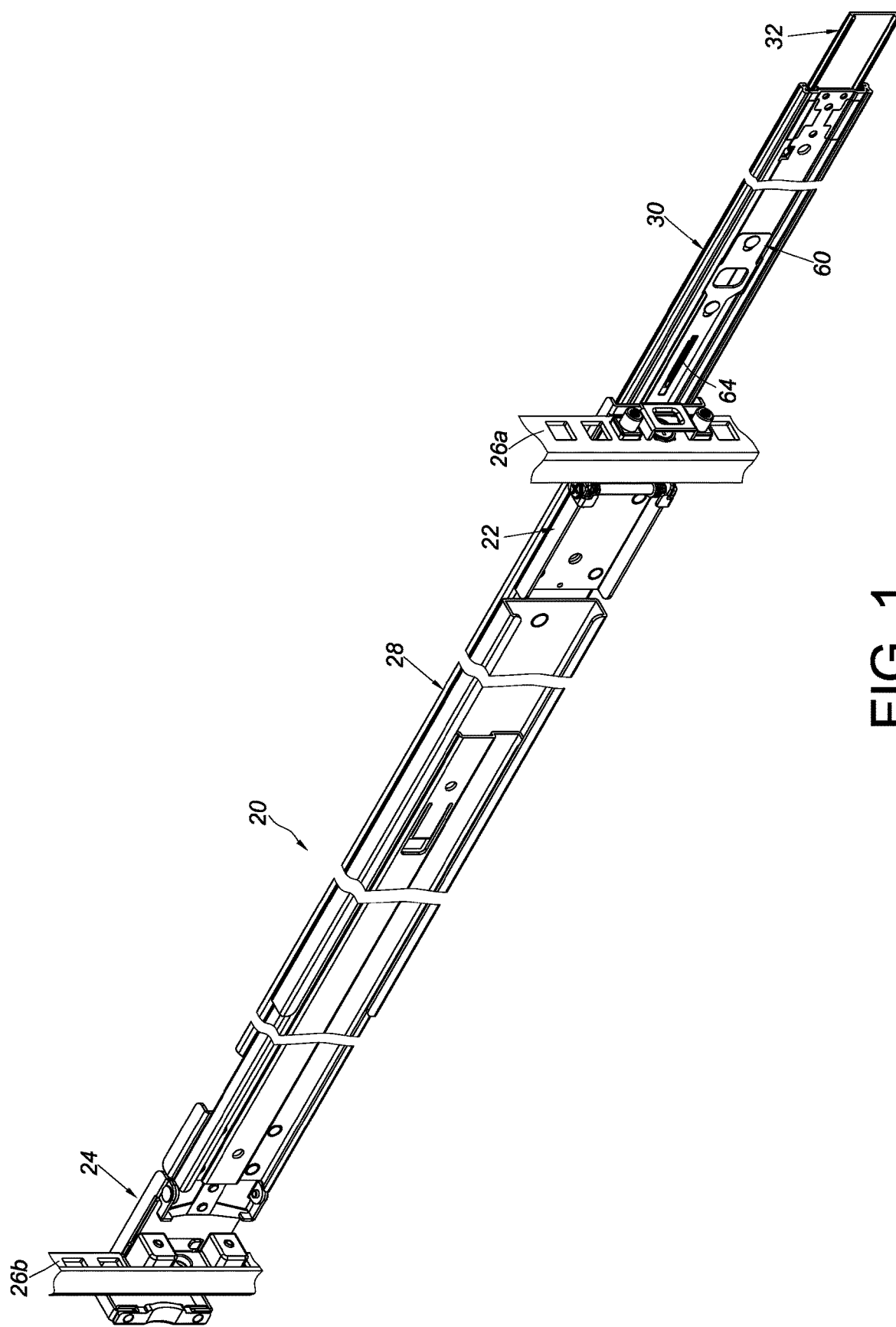
FIG. 1 is a perspective view of the slide rail assembly according to an embodiment of the present invention, showing the slide rail assembly mounted on a rack and being in an extended state.

Referring to FIG. 1, the slide rail assembly 20 according to an embodiment of the present invention is mounted on a first post 26a and a second post 26b of a rack via a first bracket device 22 and a second bracket device 24 respectively.

Figure 2:
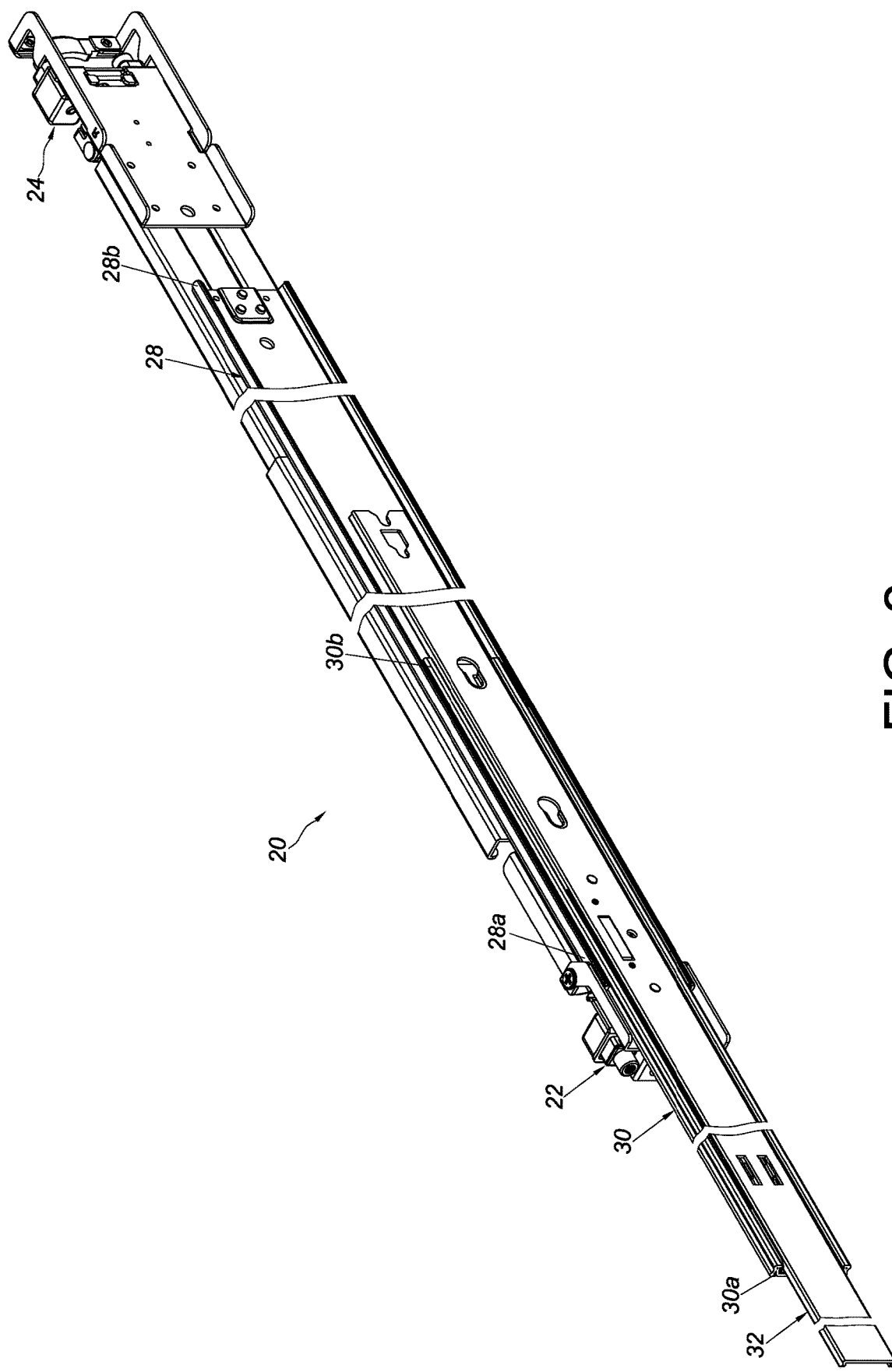
FIG. 2 is another perspective view of the slide rail assembly according to the embodiment of the present invention, showing the slide rail assembly being in an extended state.
Figures 3, 4:
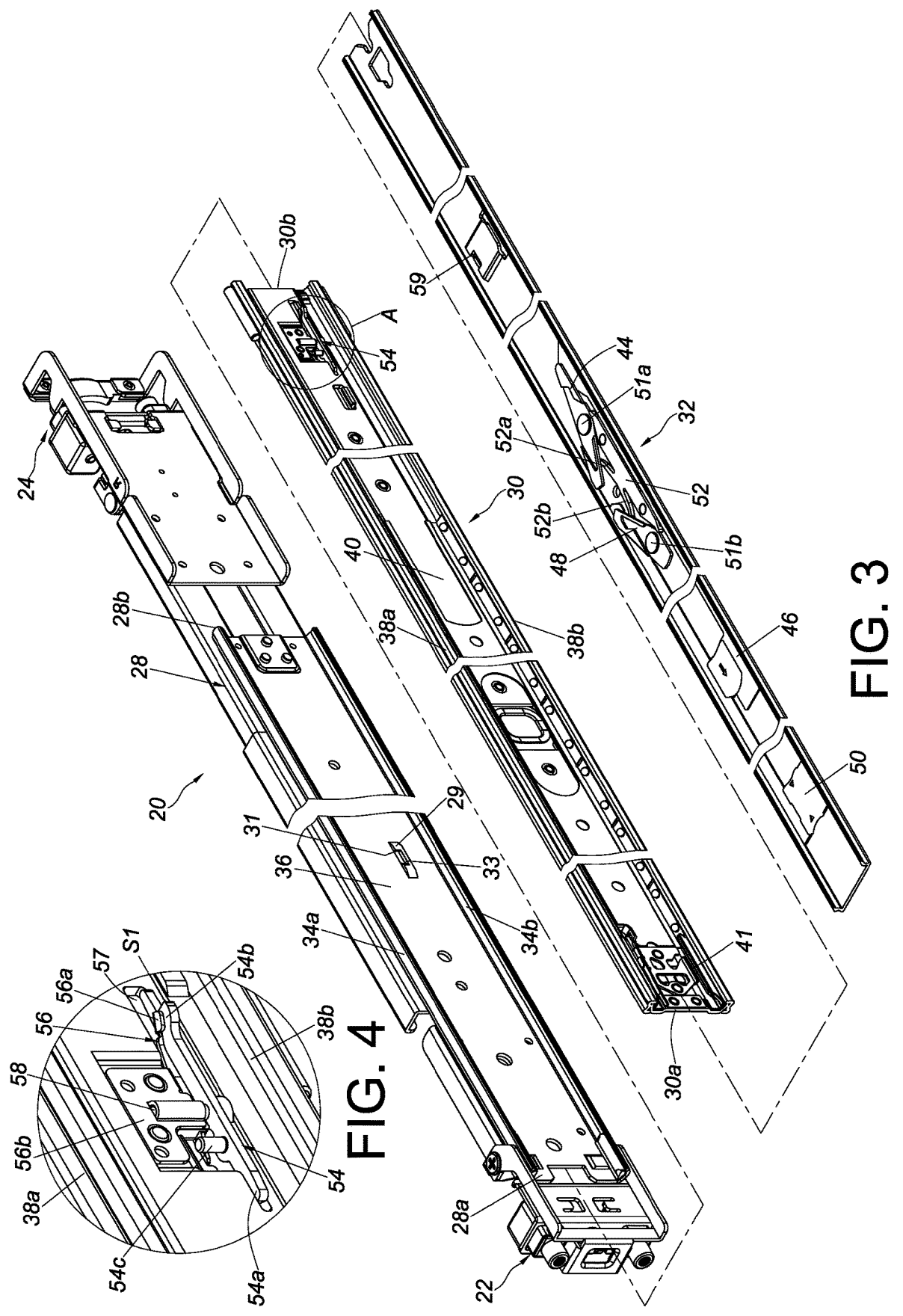

As shown in FIG. 2 and FIG. 3, the slide rail assembly 20 includes a first rail 28, a second rail 30, and a third rail 32. The second rail 30 is movably mounted between the first rail 28 and the third rail 32 to increase the distance for which the third rail 32 can be displaced with respect to the first rail 28.

The first rail 28 has a first end portion 28a and a second end portion 28b, such as but not limited to a front portion and a rear portion. The first bracket device 22 is disposed adjacent to the first end portion 28a of the first rail 28, and the second bracket device 24 is disposed adjacent to the second end portion 28b of the first rail 28. More specifically, the first rail 28 includes a first wall 34a, a second wall 34b, and a longitudinal wall 36 connected between the first wall 34a and the second wall 34b. The first wall 34a, the second wall 34b, and the longitudinal wall 36 of the first rail 28 jointly define a first channel. Preferably, the first rail 28 includes a guiding portion 29 and a blocking feature 31 adjacent to the guiding portion 29. The guiding portion 29 is preferably an inclined surface or a curved surface.

The second rail 30 is mounted in the first channel of the first rail 28. The second rail 30 has a first end portion 30a and a second end portion 30b, such as but not limited to a front portion and a rear portion. More specifically, the second rail 30 includes a first wall 38a, a second wall 38b, and a longitudinal wall 40 connected between the first wall 38a and the second wall 38b. The first wall 38a, the second wall 38b, and the longitudinal wall 40 of the second rail 30 jointly define a second channel Preferably, the second rail 30 includes a first side and a second side, which is the opposite side of the first side. The first side faces the first rail 28 while the second side faces the third rail 32. Preferably, the second rail 30 includes an abutting feature 41, and the abutting feature 41 is disposed adjacent to the first end portion 30a of the second rail 30, is located on the longitudinal wall 40, and is in the second channel. For instance, the abutting feature 41 is a projection protruding laterally (or transversely) from the longitudinal wall 40 of the second rail 30.

The third rail 32 is mounted in the second channel of the second rail 30. Preferably, the slide rail assembly 20 further includes a releasing mechanism, and the releasing mechanism includes a working member 44 located on the third rail 32 and a releasing member 46 operably connected to the working member 44. Preferably, the slide rail assembly 20 further includes a second releasing mechanism, and the second releasing mechanism includes a second working member 48 located on the third rail 32 and a second releasing member 50 operably connected to the second working member 48. The two working members 44 and 48 are pivotally connected to the third rail 32 through a first shaft 51a and a second shaft 51b respectively. A base 52 has a first elastic portion 52a and a second elastic portion 52b for applying elastic forces to the two working members 44 and 48 respectively and thereby keeping the two working members 44 and 48 in a first working state. Both releasing mechanisms face the second rail 30 and correspond to the abutting feature 41.

The slide rail assembly 20 further includes a locking member 54 and an elastic member 56 (see also FIG. 4). The locking member 54 is movably mounted on the second rail 30, such as at a position corresponding to an empty space 57 (e.g., an opening) in the second rail 30, wherein the empty space 57 brings the first side and the second side of the second rail 30 into communication. The elastic member 56 applies an elastic force to the locking member 54 and thereby keeps the locking member 54 in a first state S1.

Figure 5:
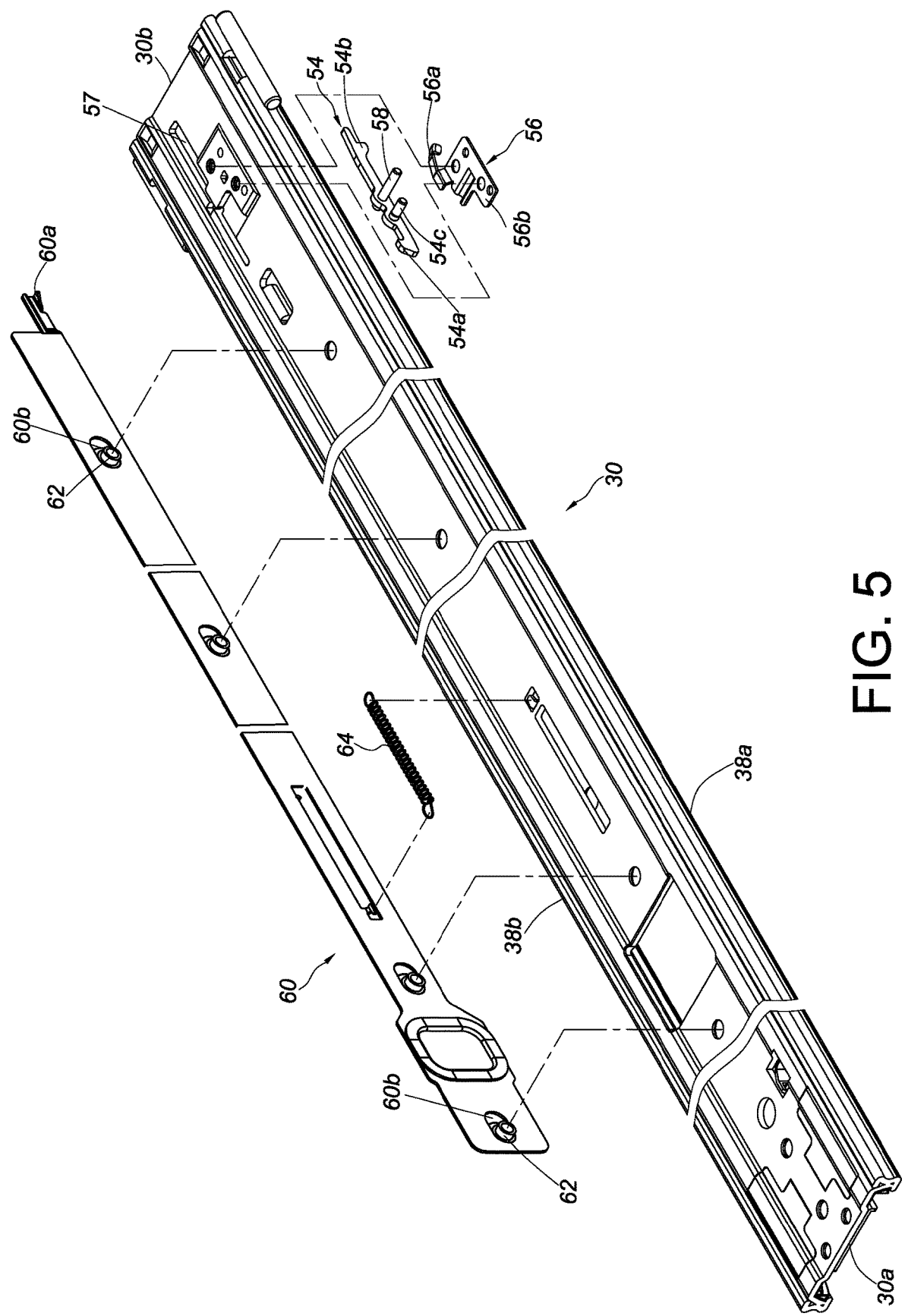
FIG. 5 is an exploded perspective view of the second rail according to the embodiment of the present invention.
Figure 6:
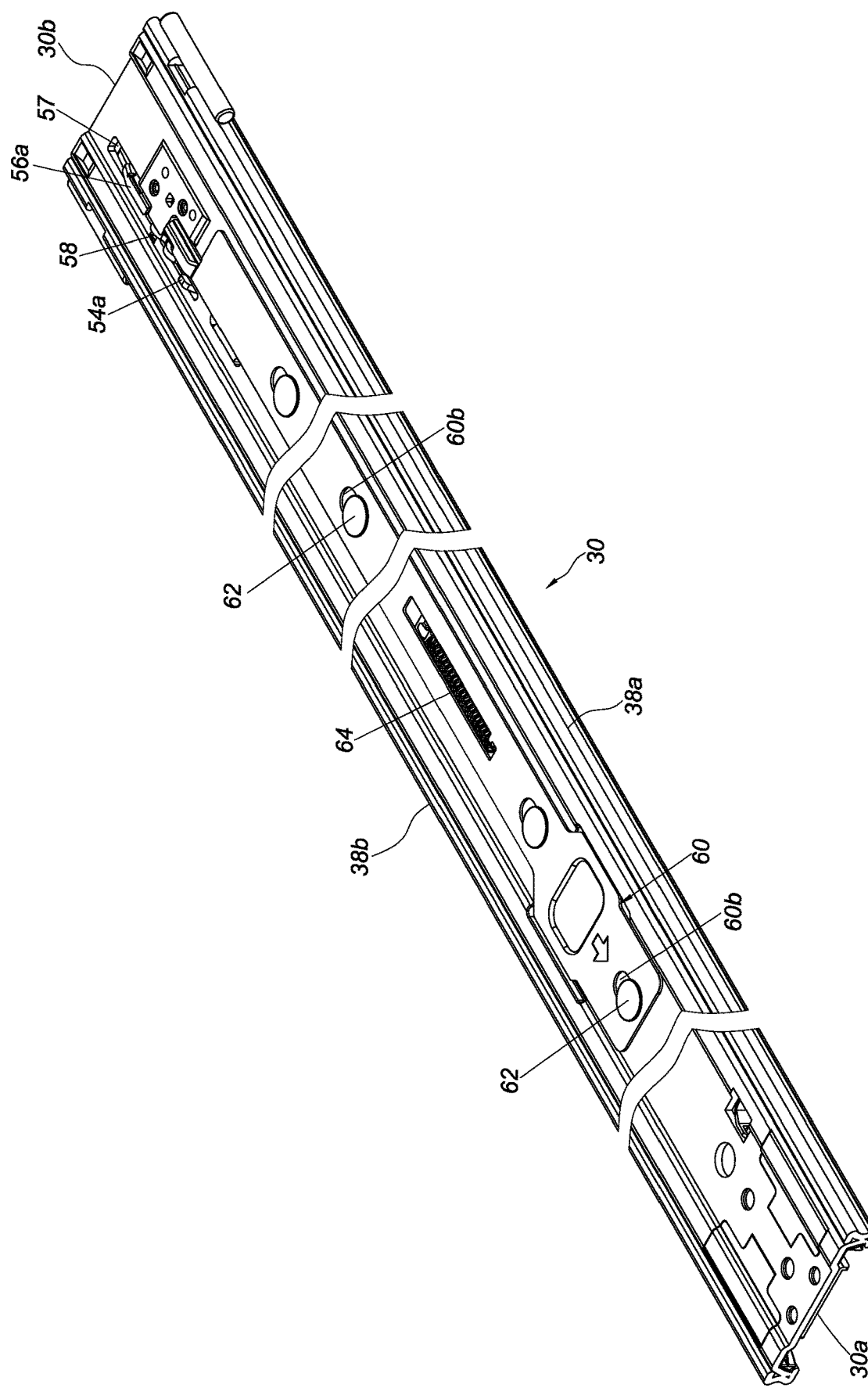
FIG. 6 is an assembled perspective view of the second rail according to the embodiment of the present invention.

As shown in FIG. 4, FIG. 5, and FIG. 6, the locking member 54 preferably includes an engaging portion 54a, a contact portion 54b, and a linking feature 54c and is pivotally connected to the second rail 30 via a pivotally connecting element 58 disposed between the engaging portion 54a and the contact portion 54b. Preferably, the pivotally connecting element 58 is a shaft whose two opposite ends face the first wall 38a and the second wall 38b of the second rail 30 respectively. The engaging portion 54a and the contact portion 54b are configured to work with the blocking feature 31 of the first rail 28 and a pushing structure 59 of the third rail 32 respectively, wherein the pushing structure 59 may be, for instance, a wall or a wall surface. Here, the pushing structure 59 is implemented as the wall of a hole (or groove) by way of example only. The linking feature 54c is disposed adjacent to the engaging portion 54a. Preferably, the elastic member 56 is disposed on the second side of the second rail 30 and has a mounting portion 56b to help keep the pivotally connecting element 58 on the second rail 30. The mounting portion 56b of the elastic member 56 is connected to the second rail 30 and includes an elastic leg 56a for supporting the locking member 54. The elastic leg 56a applies an elastic load to a portion of the locking member 54 that is adjacent to the contact portion 54b.

As shown in FIG. 5 and FIG. 6, the slide rail assembly 20 further includes an operating member 60, and the operating member 60 is operably connected to the first side of the second rail 30.

Preferably, the operating member 60 has a predetermined longitudinal length and includes a driving portion 60a. The driving portion 60a extends through the empty space 57, corresponds to the linking feature 54c of the locking member 54, and is configured to work in conjunction with the linking feature 54c. More specifically, the operating member 60 includes at least one slot 60b, and the slide rail assembly 20 further includes at least one supporting member 62. The at least one supporting member 62 extends through a portion of the at least one slot 60b and mounts the operating member 60 to the first side of the second rail 30.

Preferably, a restoring spring 64 is mounted between the operating member 60 and the second rail 30.

Preferably, one of the driving portion 60a of the operating member 60 and the linking feature 54c of the locking member 54 includes an inclined surface or a curved surface. Here, by way of example only, the driving portion 60a of the operating member 60 has an inclined surface, and the linking feature 54c of the locking member 54 is a rod with a curved surface (e.g., a surface with a circular contour).

FIG. 7 shows the slide rail assembly 20 in a retracted state, with the second rail 30 at a first position P1 (e.g., a retracted position) with respect to the first rail 28, and with the third rail 32 retracted with respect to the second rail 30. As shown in FIG. 8, the operating member 60 remains at an initial position in response to the elastic force of the restoring spring 64. It is worth mentioning that the at least one supporting member 62 and the at least one slot 60b of the operating member 60 are omitted from FIG. 7 and FIG. 8 for the sake of simplicity.

As shown in FIG. 7, the locking member 54 remains in the first state S1 in response to the elastic force of the elastic member 56. In addition, when the slide rail assembly 20 is in the retracted state as shown in FIG. 7, the engaging portion 54a of the locking member 54 is spaced apart from the blocking feature 31 of the first rail 28, and the pushing structure 59 of the third rail 32 is spaced apart from the contact portion 54b of the locking member 54.

When the third rail 32 is displaced in a first direction D1 (e.g., an opening direction), referring to FIG. 9, the pushing structure 59 of the third rail 32 is brought into contact with the contact portion 54b of the locking member 54 (which is now in the first state S1). Thus, with the pushing structure 59 in contact with the contact portion 54b of the locking member 54, the second rail 30 can be driven by, and displaced in the first direction D1 simultaneously with, the third rail 32.

When the second rail 30 reaches a predetermined position after being displaced by the third rail 32 in the first direction D1, referring to FIG. 10, the engaging portion 54a of the locking member 54 contacts the guiding portion 29 of the first rail 28.

When the second rail 30 is further displaced by the third rail 32 in the first direction D1, referring to FIG. 11, the engaging portion 54a of the locking member 54 remains in contact with the guiding portion 29 of the first rail 28 such that a force acting on the engaging portion 54a is generated. The locking member 54 responds to the force by rotating about the pivotally connecting element 58 through an angle and ends up no longer in the first state S1 (e.g., entering a second state S2). Consequently, the contact portion 54b of the locking member 54 is separated from the pushing structure 59 of the third rail 32, and the simultaneous displacement relationship between the third rail 32 and the second rail 30 is thereby terminated. The elastic leg 56a of the elastic member 56 stores an elastic force while the locking member 54 is in the second state S2.

Figure 12A:
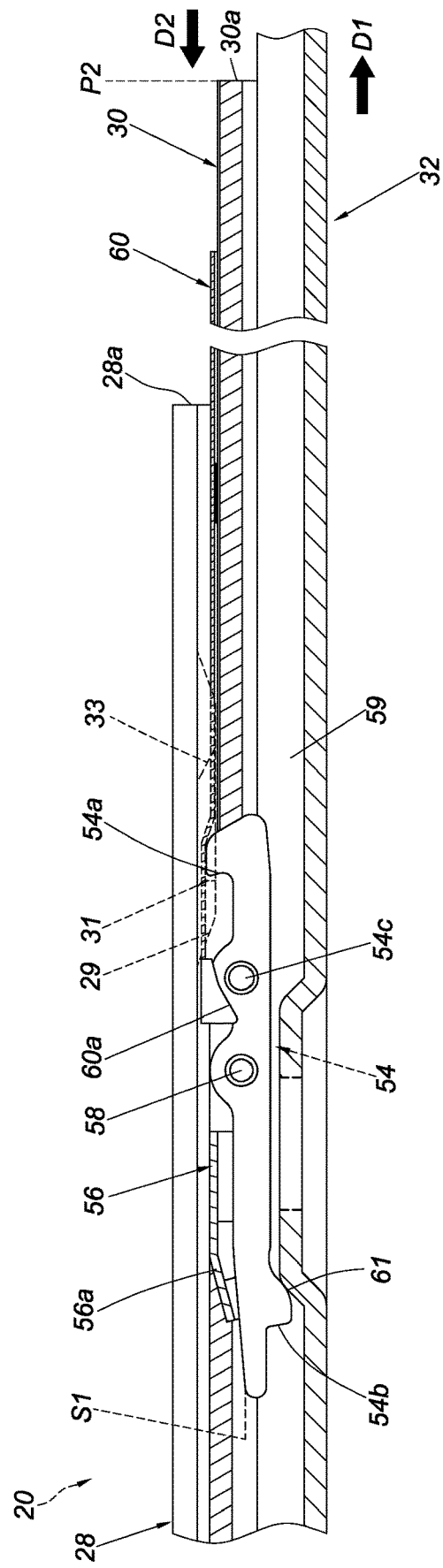
FIG. 12A is a schematic view of the slide rail assembly according to the embodiment of the present invention, showing that the second rail is disengaged from the first rail by the disengaging feature on the third rail and is therefore allowed to be displaced in the second direction.

When the second rail 30 is further displaced in the first direction D1 with respect to the first rail 28 and reaches a second position P2 (e.g., an extended position), referring to FIG. 12, the engaging portion 54a of the locking member 54 moves past the guiding portion 29 of the first rail 28 such that the locking member 54 returns to the first state S1 in response to the elastic force released by the elastic leg 56a of the elastic member 56. As a result, the engaging portion 54a of the locking member 54 is locked to the blocking feature 31 of the first rail 28, preventing the second rail 30 from being displaced in a second direction D2 (e.g., a retracting direction) with respect to the first rail 28 from the second position P2 toward the first position P1. Preferably, the first rail 28 further includes a second blocking feature 33 so that when the second rail 30 is at the second position P2, the engaging portion 54a of the locking member 54 (with the locking member 54 in the first state S1) is located between the two blocking features 31 and 33 of the first rail 28 in order for the second blocking feature 33 to prevent the second rail 30 from being further displaced in the first direction D1 and hence from being pulled out with respect to the first rail 28. When the second rail 30 is at the second position P2, the first end portion 30a of the second rail 30 is a certain distance ahead of the first end portion 28a of the first rail 28. The third rail 32 in this state can be displaced in the first direction D1 with respect to the second rail 30 now that the simultaneous displacement relationship between the third rail 32 and the second rail 30 has been terminated. Referring to FIG. 12A, the third rail 32 is provided with a disengaging feature 61, such as an inclined surface. When the third rail 32 is displaced in the second direction D2, the disengaging feature 61 is brought into contact with the contact portion 54b and begins to switch the locking member 54 from the first state S1 to the second state S2. Once the locking member 54 enters the second state S2, the second rail 30 can be displaced from the second position P2 back to the first position P1 in the second direction D2.

Referring to FIG. 13 to FIG. 15, when the second rail 30 is at the second position P2 with respect to the first rail 28, a user can operate the operating member 60 manually by applying thereto a force F that acts in the first direction D1, in order for the driving portion 60a of the operating member 60 to push the linking feature 54c of the locking member 54 and thereby switch the locking member 54 from the first state S1 (as shown in FIG. 13) to the second state S2 (as shown in FIG. 15), the objective being to unlock the engaging portion 54a of the locking member 54 from the blocking feature 31 of the first rail 28 so that the second rail 30 can be displaced in the second direction D2 with respect to the first rail 28 from the second position P2 toward the first position P1 (see FIG. 15). It is worth mentioning that the restoring spring 64 stores an elastic force while the force F is being applied to the operating member 60 (see FIG. 14). As soon as the user stops applying the force F, the restoring spring 64 will release the stored elastic force and thereby bring the operating member 60 back to its initial position.

Referring to FIG. 16, the working member 44 is in the first working state Y1 and corresponds in position to the abutting feature 41 of the second rail 30. Similarly, the working member 48 is in the first working state Y1 and corresponds in position to the abutting feature 41 of the second rail 30. More specifically, when the second rail 30 is at the second position P2 with respect to the first rail 28 and the third rail 32 arrives at a predetermined position after being displaced with respect to the second rail 30 in the first direction D1, the working member 48 is in the first working state Y1 and is in contact with a first side of the abutting feature 41 of the second rail 30.

When the third rail 32 is further displaced with respect to the second rail 30 in the first direction D1, referring to FIG. 17, the contact between the working member 48 and the abutting feature 41 of the second rail 30 results in a force that rotates the working member 48 about the second shaft 51b through an angle; consequently, the working member 48 is brought into a second working state Y2, in which the working member 48 no longer corresponds in position to the abutting feature 41 and therefore can be moved past the first side of the abutting feature 41. Once the working member 48 moves past the first side of the abutting feature 41, the second elastic portion 52b of the base 52 stores an elastic force.

When the third rail 32 reaches a third position P3 (e.g., a fully extended position) after being displaced with respect to the second rail 30 in the first direction D1 and thus brings the slide rail assembly 20 into an extended state (e.g., a fully extended state), referring to FIG. 18, the working member 48 returns to the first working state Y1 in response to the elastic force released by the second elastic portion 52b of the base 52 and ends up on a second side of the abutting feature 41. Meanwhile, the working member 44 remains in the first working state Y1 and is on the first side of the abutting feature 41. In other words, the two working members 44 and 48 are now in the first working state Y1 and located on the two opposite sides of the abutting feature 41 respectively, preventing the third rail 32 at the third position P3 from being displaced in either of the first direction D1 and the second direction D2. When the third rail 32 is at the third position P3, however, a user can operate the releasing member 46 or 50 and thereby bring the corresponding working member 44 or 48 out of the first working state Y1 so that the third rail 32 can be displaced from the third position P3 in the first direction D1 or the second direction D2.

Figure 20:
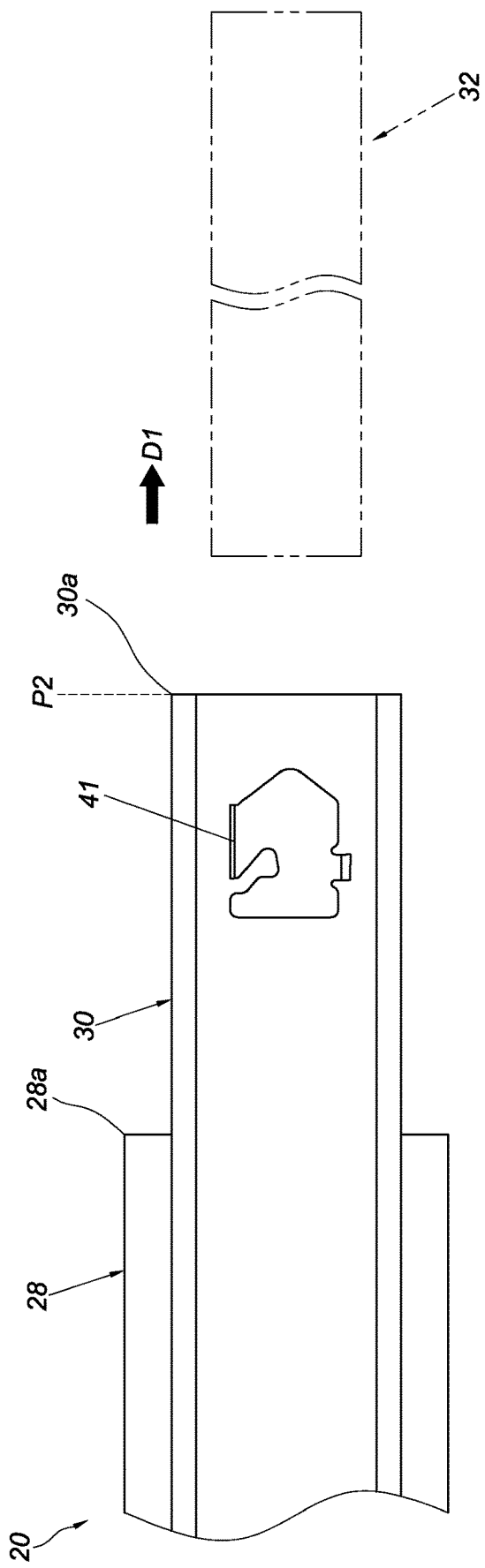
FIG. 20 is a schematic view of the slide rail assembly according to the embodiment of the present invention, showing that the second rail is at the second position with respect to the first rail, and that the third rail is detached from the second rail.

For instance, when the releasing member 46 is operated as shown in FIG. 19, the working member 44 is driven by a driving feature 46a of the releasing member 46 and thus switched from the first working state Y1 to the second working state Y2, in which the working member 44 no longer corresponds in position to, and can therefore be moved past, the first side of the abutting feature 41, allowing the third rail 32 to be displaced from the third position P3 in the first direction D1 with respect to the second rail 30 until detached from the second rail 30, as shown in FIG. 20.

Figure 21:
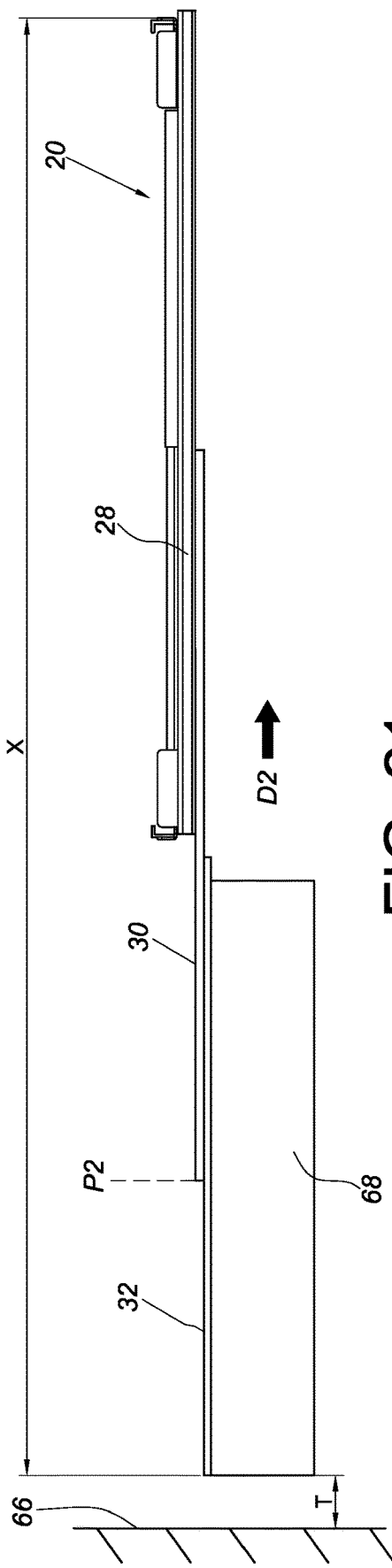
FIG. 21 is a schematic view of the slide rail assembly according to the embodiment of the present invention, showing that the slide rail assembly is mounted on the rack and in the extended state such that a limited space exists between the slide rail assembly and an obstacle in the environment.
Figure 22:
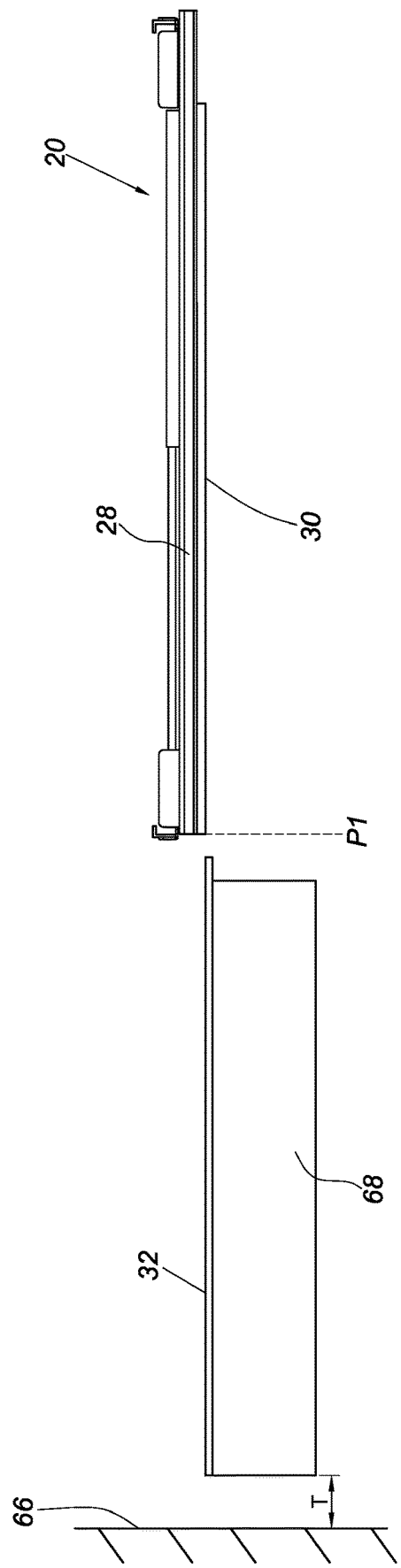
FIG. 22 is a schematic view of the slide rail assembly according to the embodiment of the present invention, showing that the third rail is detached from the second rail despite the limited space after the second rail is retracted with respect to the first rail.

Referring to FIG. 21, the slide rail assembly 20 has an extended length X when in the extended state, and only a limited space T (e.g., a narrow space) exists between the slide rail assembly 20 having the extended length X and an obstacle 66 in the environment. The limited space T, however, may sometimes hinder an operator from performing maintenance work on the third rail 32 or on the object 68 carried by the third rail 32; for instance, the operator may have problem detaching the third rail 32 from the second rail 30 in the first direction D1 because of the obstacle 66. In that case, the foregoing technical features of the present invention can be of assistance by allowing the operator to operate the operating member 60 (see FIG. 14 and FIG. 15) and thereby switch the locking member 54 from the first state S1 to the second state S2 so that the second rail 30 can be displaced, or retracted, with respect to the first rail 28 from the second position P2 toward the first position P1 in the second direction D2 (see FIG. 21) to facilitate detachment of the third rail 32 despite the limited space T (see FIG. 22).

According to the above, the slide rail assembly 20 disclosed in the foregoing embodiment has the following technical features:

1. The operating member 60 can be manually operated in order for the driving portion 60a of the operating member 60 to drive the linking feature 54c of the locking member 54, thereby switching the locking member 54 from the first state S1 to the second state S2, allowing the second rail 30 to be displaced with respect to the first rail 28 from the second position P2 toward the first position P1.
2. The operating member 60 is configured to be operated in the first direction D1 (e.g., the opening direction) and hence can be operated intuitively; that is to say, a user can apply the force F to the operating member 60 in an intuitive manner in order for the operating member 60 to drive the locking member 54. Moreover, with either the driving portion 60a of the operating member 60 or the linking feature 54c of the locking member 54 including an inclined or curved surface, and with the linking feature 54c disposed adjacent to the engaging portion 54a of the locking member 54, applying the force F to the operating member 60 will cause the driving portion 60a of the operating member 60 to push the linking feature 54c of the locking member 54 so that the engaging portion 54a of the locking member 54 can be driven, and consequently unlocked from the blocking feature 31 of the first rail 28, with ease (see FIG. 15).
3. Thanks to the contact portion 54b of the locking member 54, the third rail 32 can displace the second rail 30 in the first direction D1 in unison.

While the present invention has been disclosed through the preferred embodiment described above, the embodiment is not intended to be restrictive of the scope of the invention. The scope of patent protection sought by the applicant is defined by the appended claims.

What is claimed is:

1. A slide rail assembly, comprising:
   a first rail;
   a second rail displaceable with respect to the first rail from a first position to a second position;
   a third rail displaceable with respect to the second rail;
   a locking member switchable between a first state and a second state, wherein the locking member is configured to prevent the second rail from displacement with respect to the first rail from the second position toward the first position when in the first state; and
   an operating member configured to be manually operated in order for a driving portion of the operating member to drive a linking feature of the locking member and thereby switch the locking member from the first state to the second state, in which the second rail is allowed to be displaced with respect to the first rail from the second position toward the first position;
   wherein when the operating member is operated in a first direction, the linking feature of the locking member is pushed by the driving portion of the operating member.

2. The slide rail assembly of claim 1, wherein the locking member is movably mounted on the second rail, and there is an elastic member for applying an elastic force to the locking member and thereby keeping the locking member in the first state.

3. The slide rail assembly of claim 2, wherein the first rail includes a guiding portion and a first blocking feature, the locking member includes an engaging portion and a contact portion, and there is a pivotally connecting element disposed between the engaging portion and the contact portion to pivotally connect the locking member to the second rail; and wherein when the locking member is in the first state, the third rail is able to drive the second rail through the contact portion of the locking member to bring about simultaneous displacement of the second rail and the third rail in a first direction; when the second rail reaches a predetermined position after the simultaneous displacement, the locking member comes into contact with the guiding portion of the first rail such that a force acts on the locking member and brings the locking member out of the first state, thereby terminating a simultaneous displacement relationship between the second rail and the third rail, with the elastic member storing an elastic force; and when the second rail reaches the second position after further displacement in the first direction, the locking member is switched back to the first state in response to the elastic force of the elastic member such that the engaging portion of the locking member is locked to the first blocking feature of the first rail to prevent the second rail from displacement from the second position to the first position in a second direction.

4. The slide rail assembly of claim 3, wherein the linking feature is disposed adjacent to the engaging portion.

5. The slide rail assembly of claim 4, wherein one of the driving portion of the operating member and the linking feature of the locking member includes an inclined or curved surface.

6. The slide rail assembly of claim 5, wherein the operating member is movably mounted on the second rail, the second rail includes two opposite sides defined respectively as a first side and a second side, the first side faces the first rail, the second side faces the third rail, and the operating member is located on the first side of the second rail.

7. The slide rail assembly of claim 6, wherein the operating member includes a slot, the slide rail assembly further comprises a supporting member, the supporting member extends through a portion of the slot and mounts the operating member to the second rail, and the slide rail assembly further comprises a restoring spring mounted to the operating member and the second rail.

8. The slide rail assembly of claim 3, wherein the first rail further includes a second blocking feature, and when the second rail is at the second position and the locking member is in the first state, the engaging portion of the locking member lies between the first blocking feature and the second blocking feature.

9. The slide rail assembly of claim 3, wherein the third rail includes a disengaging feature, and when the third rail is displaced in the second direction, the disengaging feature is brought into contact with the contact portion and switches the locking member from the first state to the second state such that the second rail is allowed to be displaced from the second position to the first position in the second direction.

10. The slide rail assembly of claim 1, wherein the second rail includes an abutting feature, the slide rail assembly further comprises a releasing mechanism, the releasing mechanism includes a working member located on the third rail, and the working member corresponds in position to the abutting feature when in a first working state and does not correspond in position to the abutting feature when in a second working state.

11. The slide rail assembly of claim 10, wherein the releasing mechanism includes a releasing member operably connected to the working member, and the working member is switchable from the first working state to the second working state in response to the releasing member being operated.

12. A slide rail assembly, comprising:
a first rail;
a second rail displaceable with respect to the first rail from a retracted position to an extended position in a first direction;
a third rail displaceable with respect to the second rail;
a locking member movably mounted on the second rail so that when the second rail is at the extended position, the locking member is locked to a blocking feature of the first rail to prevent the second rail from displacement with respect to the first rail from the extended position to the retracted position in a second direction; and
an operating member operably connected to the second rail and including a driving portion;
wherein when the operating member is operated, the driving portion of the operating member drives a linking feature of the locking member and thereby unlocks the locking member from the blocking feature of the first rail;
wherein when the operating member is operated in the first direction, the linking feature of the locking member is pushed by the driving portion of the operating member.

13. The slide rail assembly of claim 12, further comprising an elastic member for applying an elastic force to the locking member and thereby keeping the locking member in a first state.

14. The slide rail assembly of claim 13, wherein the locking member includes an engaging portion and a contact portion, the slide rail assembly further comprises a pivotally connecting element for pivotally connecting the locking member to the second rail, the pivotally connecting element is located between the engaging portion and the contact portion, the linking feature is disposed adjacent to the engaging portion, the elastic member applies an elastic load to a portion of the locking member that is adjacent to the contact portion, and the engaging portion of the locking member is configured to be locked to the blocking feature when the locking member is in the first state.

15. The slide rail assembly of claim 14, wherein one of the driving portion of the operating member and the linking feature of the locking member includes an inclined or curved surface.

16. The slide rail assembly of claim 12, wherein the second rail includes two opposite sides defined respectively as a first side and a second side, the first side faces the first rail, the second side faces the third rail, and the operating member is located on the first side of the second rail.

17. The slide rail assembly of claim 12, wherein the locking member includes an engaging portion and a contact portion, the linking feature of the locking member including a rod disposed between the engaging and contact portions, the rod projecting transversely to engage the driving portion of the operating member.

18. The slide rail assembly of claim 12, wherein the operating member includes a slot, the slide rail assembly further comprises a supporting member, and the supporting member extends through a portion of the slot and mounts the operating member to the second rail.

19. The slide rail assembly of claim 12, wherein the second rail includes an abutting feature, the slide rail assembly further comprises a releasing mechanism, the releasing mechanism includes a working member located on the third rail, the working member corresponds in position to the abutting feature when in a first working state and does not correspond in position to the abutting feature when in a second working state, the releasing mechanism further includes a releasing member operably connected to the working member, and the working member is switchable from the first working state to the second working state in response to the releasing member being operated.

* * * * *